United States Patent
Liu et al.

(10) Patent No.: US 10,568,235 B2
(45) Date of Patent: Feb. 18, 2020

(54) ON-BOARD CHARGER WITH HEAT DISSIPATION STRUCTURE

(71) Applicant: Shenzhen Vmax Power Co., Ltd., Shenzhen, Guangdong (CN)

(72) Inventors: Jun Liu, Guangdong (CN); Yingying Feng, Guangdong (CN); Shun Yao, Guangdong (CN)

(73) Assignee: SHENZHEN VMAX POWER CO., LTD., Shenzhen (CN)

( * ) Notice: Subject to any disclaimer, the term of this patent is extended or adjusted under 35 U.S.C. 154(b) by 0 days.

(21) Appl. No.: 16/234,763

(22) Filed: Dec. 28, 2018

(65) Prior Publication Data

US 2019/0208666 A1 Jul. 4, 2019

(30) Foreign Application Priority Data

Jan. 4, 2018 (CN) .......................... 2018 1 0007168

(51) Int. Cl.
| | |
|---|---|
| *H05K 7/20* | (2006.01) |
| *B60L 53/22* | (2019.01) |
| *H02J 7/00* | (2006.01) |
| *H05K 7/14* | (2006.01) |

(52) U.S. Cl.
CPC .......... *H05K 7/20272* (2013.01); *B60L 53/22* (2019.02); *H02J 7/0042* (2013.01); *H05K 7/1427* (2013.01); *H05K 7/20872* (2013.01); *H05K 7/20927* (2013.01); *B60L 2210/30* (2013.01); *B60L 2240/36* (2013.01); *Y02T 10/7005* (2013.01)

(58) Field of Classification Search
CPC . H05K 7/20254; H05K 7/20272; B60L 53/22
See application file for complete search history.

(56) References Cited

U.S. PATENT DOCUMENTS

| | | | | |
|---|---|---|---|---|
| 5,661,902 A | * | 9/1997 | Katchmar | H01L 23/3672 174/252 |
| 9,578,790 B2 | * | 2/2017 | Kodama | B60L 3/003 |
| 2017/0182896 A1 | * | 6/2017 | Masip | H02J 7/0042 |

* cited by examiner

*Primary Examiner* — Mukundbhai G Patel
(74) *Attorney, Agent, or Firm* — Locke Lord LLP; Tim Tingkang Xia, Esq.

(57) ABSTRACT

The present invention discloses an on-board charger with a heat dissipation structure. The on-board charger comprises a casing, and heat generating components, a PCB and a heat dissipation structure which are arranged inside the casing, and is characterized in that the heat dissipation structure is a coolant flow channel; the coolant flow channel is arranged longitudinally with respect to the heat generating components, and is in full contact with each heat generating component; heat is dissipated from the heat generating components by using respective surfaces of the coolant flow channel. The on-board charger with the heat dissipation structure provided by the present invention has the advantages of small size, excellent heat dissipation effect, simple assembly, low cost and light weight.

4 Claims, 4 Drawing Sheets

ON-BOARD CHARGER WITH HEAT DISSIPATION STRUCTURE

CROSS-REFERENCE TO RELATED PATENT APPLICATION

This non-provisional application claims priority to and the benefit of, pursuant to 35 U.S.C. § 119(a), patent application Serial No. CN201810007168.3 filed in China on Jan. 4, 2018. The disclosure of the above application is incorporated herein in its entirety by reference.

FIELD

The present invention relates to the technical field of charging of pure electric vehicles and hybrid electric vehicles, in particular to an on-board charger with a heat dissipation structure.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the energy saving and emission reduction, as well as the need to control air pollution, new energy vehicles are gradually gaining the favor of users, and electric vehicles are the main force of new energy vehicles. Electric vehicles are divided into pure electric vehicles and hybrid electric vehicles, wherein an on-board charger (OBC) functions as an important part of electric vehicles. The on-board charger includes heat generating components such as an inductor, a rectifier, a transformer, and a field-effect transistor. If the heat cannot be dissipated in time during operation, these heat generating components will adversely affect the use and life of the charger. In the existing charger, a heat dissipating component is disposed at the bottom of a casing, and a coolant flows horizontally, away from heat-generating elements, so the heat dissipation capability is insufficient.

SUMMARY

An objective of the present invention is to provide an on-board charger with a heat dissipation structure against the defects existing in the prior art.

The present invention provides an on-board charger with a heat dissipation structure, comprising a casing, and heat generating components, a PCB and a heat dissipation structure which are arranged inside the casing, wherein the heat dissipation structure is a coolant flow channel; the coolant flow channel is arranged longitudinally with respect to the heat generating components, and is in full contact with each heat generating component; heat is dissipated from the heat generating components by using respective surfaces of the coolant flow channel.

The heat generating components include a rectifier, a transformer, an inductor, a SMD switch tube, a male tab switch tube and other magnetic elements.

The male tab switch tube is arranged on the sidewall of the coolant flow channel, and a heat conducting sheet is arranged between the coolant flow channel and the male tab switch tube.

The PCB is provided with a plurality of through holes which are penetrated up and down; the SMD switch tube is fixed on the PCB board and corresponds to the through holes; an insulating film is arranged between the PCB and the coolant flow channel; the insulating film is provided with heat conducting glue; after the PCB is fixedly pressed on the coolant flow channel, the heat conducting glue is in contact with the SMD switch tube through the through holes in the PCB; the SMD switch tube exchanges heat with the coolant flow channel through the heat conducting glue.

Preferably, the casing includes a casing body, and a mounting chamber formed inside the casing body; the heat generating components are arranged in the mounting chamber; the coolant flow channel is mounted around the sidewall of the mounting chamber; a space between each of the heat generating components and the mounting chamber is encapsulated with a heat conducting encapsulant.

Preferably, the coolant flow channel includes: an elliptical flow channel body; a flow channel upper cover that cooperates with the flow channel body and a casing chamber; and a liquid inlet and a liquid outlet that are arranged on the sidewall of the casing and communicated with the flow channel body.

Preferably, the flow channel body is arranged in the sidewall of the mounting chamber.

Preferably, the male tab switch tube is arranged on the outer sidewall of the mounting chamber in which the heat generating components are located.

The SMD switch tube exchanges heat with the upper end surface of the sidewall of the mounting chamber through the heat conducting glue.

Compared with the prior art, the on-board charger provided by the present invention has the advantages of small size, excellent heat dissipation effect, simple assembly, low cost and light weight.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention will be further described below in conjunction with the accompanying drawings and embodiments.

Figure 1:
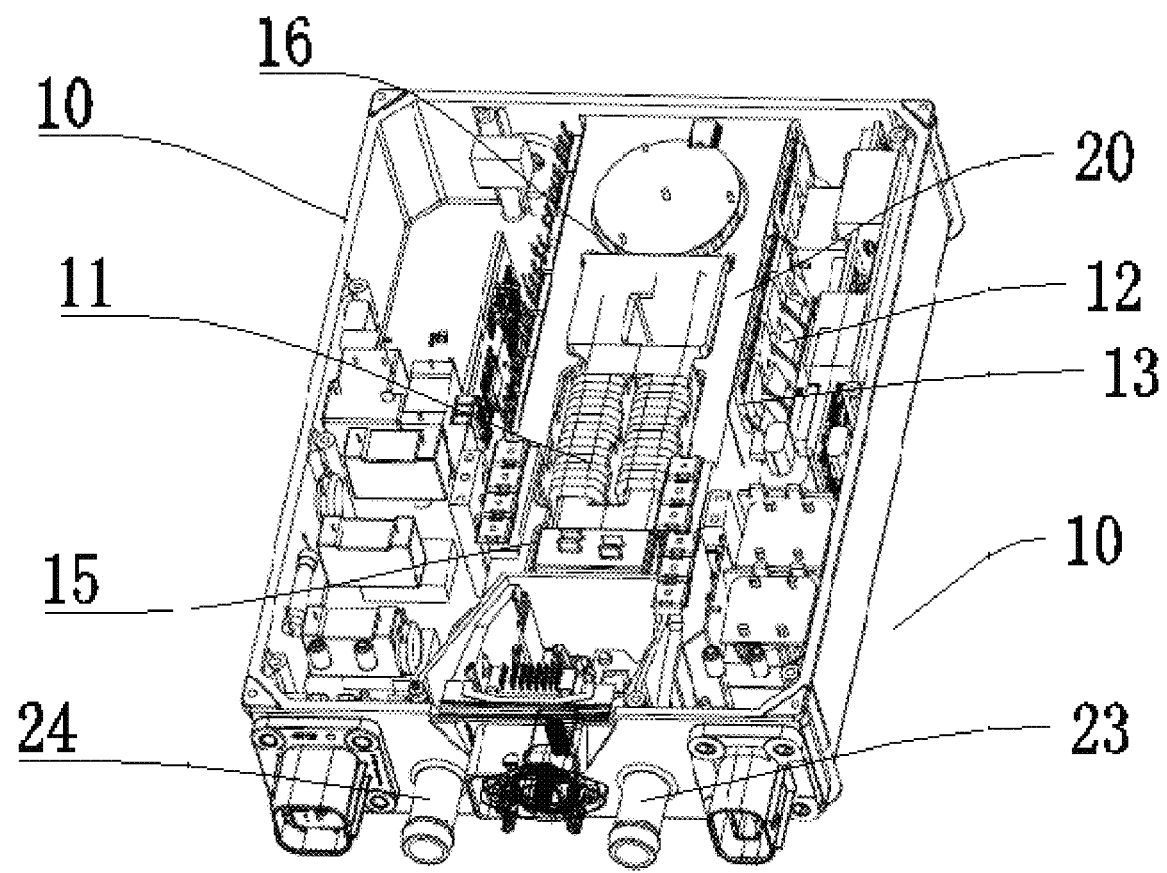
FIG. 1 is a schematic structural diagram of an on-board charger of the present invention.

As shown in FIG. 1, an on-board charger provided by the present invention comprises a casing 10, and heat generating components, a PCB 30 and a heat dissipation structure which are arranged in the casing. The heat generating components include a rectifier, a transformer, an inductor, a SMD switch tube, a male tab switch tube or other magnetic elements, such as a magnetic element 11, a SMD switch tube 12 and a male tab switch tube 17 shown in FIGS. 1-3.

The heat dissipation structure is an elliptical coolant flow channel 20. The coolant flow channel is arranged longitudinally with respect to the magnetic elements, and is in full contact with each magnetic heat generating component. Heat is dissipated from the heat generating components by using respective surfaces of the coolant flow channel.

The male tab switch tube 12 is arranged on the sidewall of the coolant flow channel 20, and exchanges heat with the coolant flow channel 20 through a heat conducting sheet 13.

Specifically, the casing 10 is a cube with the upper end surface being open, and a coolant flow channel 20 is arranged in the middle within the casing 10, and arranged longitudinally with respect to the magnetic elements. Due to the adoption of such design, the heat dissipation effect is greatly improved compared with the heat dissipation structure in the prior art. In the prior art, the coolant flow channel is arranged in a plane, the magnetic elements are located above the coolant flow channel, such that only the lower parts of the magnetic elements can exchange heat with the coolant flow channel, resulting in a relatively poor effect. Other male tab switch tubes and SMD switch tubes are far away from the coolant flow channel, and are not in direct contact, such that the heat dissipation effect is considerably poor.

In the present invention, the coolant flow channel 20 is arranged longitudinally, such that the sidewall of the magnetic element 11 is in contact with the coolant flow channel 20. In the meantime, the bottom surface of the casing is further provided with a gap. The coolant flow channel is communicated with the gap, such that the coolant flow channel 20 can perform heat exchange directly on the bottom surface and the side surface of the magnetic element 11 while in operation, and therefore, heat dissipation is accelerated.

It should be noted that in order to accelerate the heat dissipation effect, a heat conducting encapsulant is added in the gap between the magnetic element 11 and the coolant flow channel 20, which greatly accelerates the heat exchange therebetween.

In an embodiment, the male tab switch tube 12 is arranged on the sidewall of the coolant flow channel 20, and meanwhile, heat transfer is performed between the male tab switch tube 12 and the coolant flow channel 20 through the heat conducting sheet 13. By means of such design, the heat dissipation of the male tab switch tube 12 is accelerated greatly.

Figure 2:
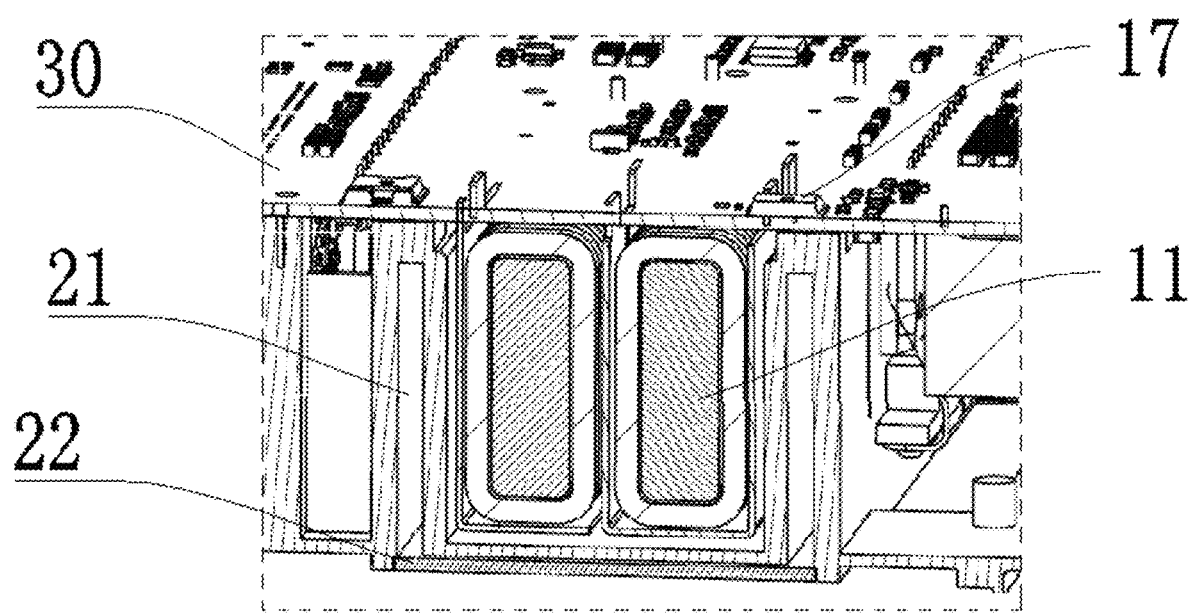
FIG. 2 is a local schematic diagram of a vertical section in FIG. 1.
Figure 3:
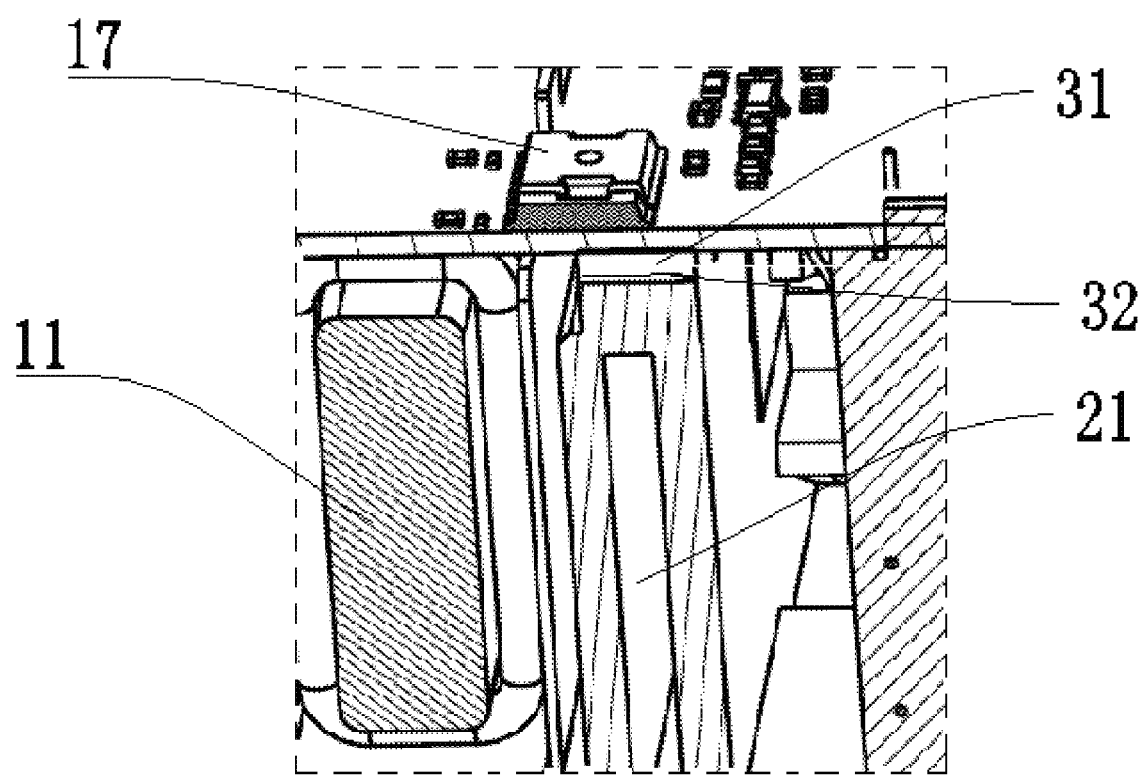
FIG. 3 is a locally enlarged view of FIG. 2.

As shown in FIGS. 2 and 3, the PCB 30 is provided with a plurality of through holes which are penetrated up and down. The SMD switch tube 17 is fixed on the PCB 30 and corresponds to the through holes. The through holes are filled with heat conducting glue 31, and the SMD switch exchanges heat with the coolant flow channel 20 through the heat conducting glue 30.

The SMD switch tube 17 is soldered to the PCB 30 by reflow soldering. The through holes in the PCB 30 are filled with the heat conducting glue 31 through which the SMD switch tube 17 is directly connected with the coolant flow channel. When the SMD switch tube 17 is heated, heat is transferred to the coolant flow channel 20 through the heat conducting glue 31, and coolant inside the coolant flow channel 20 takes heat away quickly.

In order to prevent the SMD switch tube 17 from causing a short circuit throughout the process, an insulating film 32 is designed between the heat conductive glue 31 and the coolant flow channel 20.

Figure 4:
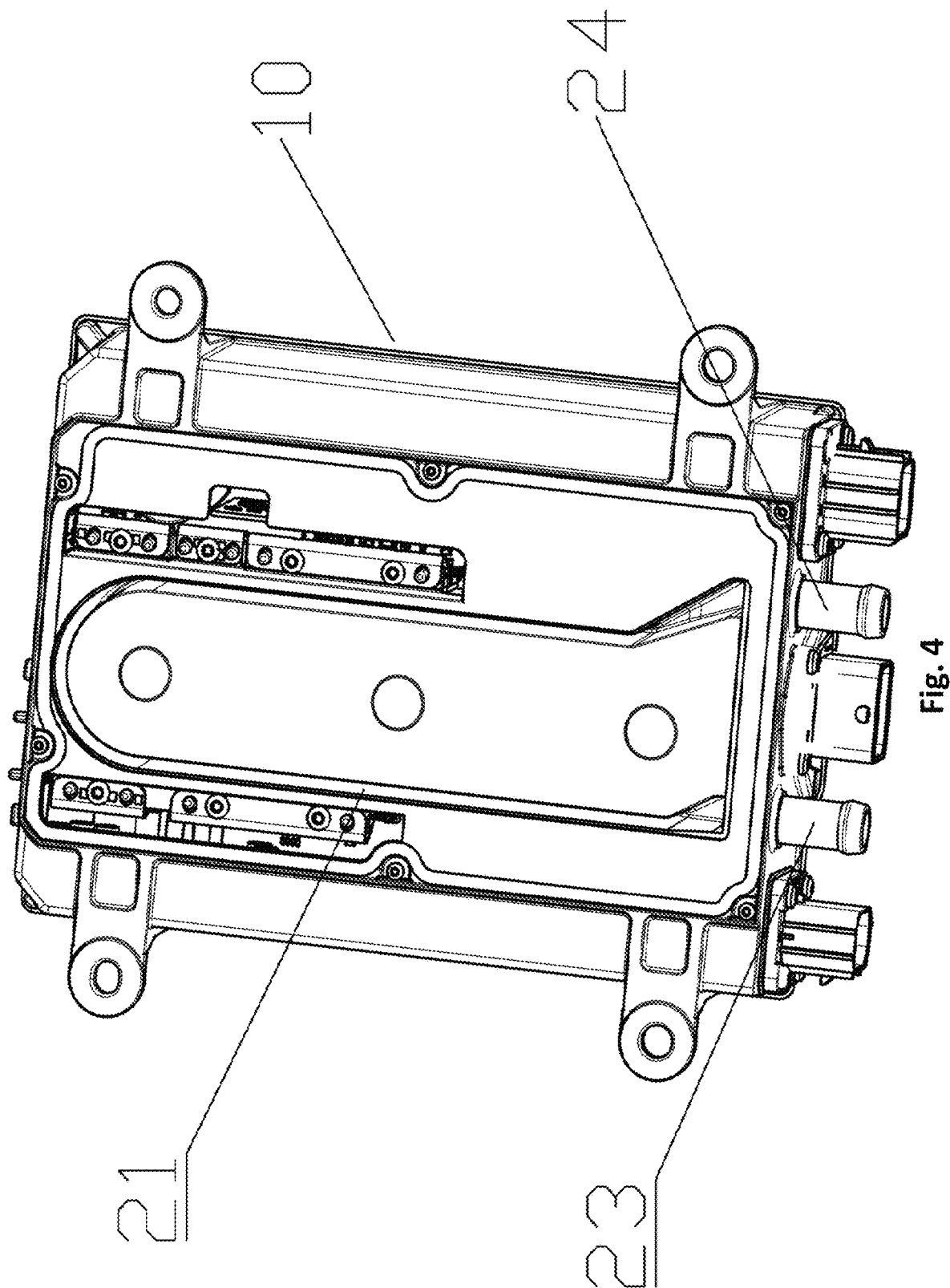
FIG. 4 is a schematic structural diagram of the bottom in FIG. 1.

As shown in FIGS. 1 and 4, the casing 10 includes a casing body 14, and a magnetic element mounting chamber 15 arranged between the coolant flow channels 20. The magnetic element 11 is mounted in the magnetic element mounting chamber 15, and then encapsulated with the heat conducting encapsulant 16.

The coolant flow channel 20 includes an elliptical flow channel body 21; a flow channel upper cover 22 that cooperates with the flow channel body 21 and a chamber of the casing 10; and a liquid inlet 23 and a liquid outlet 24 that are arranged on the sidewall of the casing 10 and communicated with the flow channel body 21.

The flow channel body 21 is arranged in the sidewall of the magnetic element mounting chamber 15.

The male tab switch tube 12 is arranged on the outer sidewall of the magnetic element mounting chamber 15.

The SMD switch tube 17 exchanges heat with the upper end surface of the sidewall of the magnetic element mounting chamber 15 through the heat conducting glue 31.

From the above, the heat dissipation structure is arranged longitudinally with respect to the heat generating components, and is in full contact with each heat generating component, such that the on-board charger of the present invention has the advantages of excellent heat dissipation effect, small size, simple assembly, low cost and light weight.

The above description is only specific embodiments of the present invention. It should be noted that any modifications, equivalents, and variations made within the spirit and scope of the present invention are intended to be included within the protection scope of the present invention.

It will be apparent to those ordinary skilled in the art that various deformations and changes may be made without departing from the spirit and scope of the invention, and these deformations and changes should all fall within the protection scope of the present invention.

What is claimed is:

1. An on-board charger with a heat dissipation structure, comprising:
    a casing, including a casing body and a mounting chamber is formed inside the casing body, wherein a bottom surface of the casing is further provided with a gap;
    heat generating components arranged inside the casing and in the mounting chamber, wherein the heat generating components include a rectifier, a transformer, an inductor, a surface mount device (SMD) switch, a male tab switch, and magnetic elements;
    a PCB arranged inside the casing; and
    a heat dissipation structure arranged inside the casing, wherein the heat dissipation structure is a coolant flow channel including: an elliptical flow channel body which is integrated in the casing body; a flow channel upper cover that cooperates with the flow channel body; and a liquid inlet and a liquid outlet that are arranged on a sidewall of the casing and communicated with the flow channel body;
    wherein the coolant flow channel is arranged in the middle within the casing and longitudinally with respect to the heat generating components, and is in full contact with each heat generating component; heat is dissipated from the heat generating components by using respective surfaces of the coolant flow channel;
    wherein the male tab switch is arranged on a sidewall of the coolant flow channel, and a heat conducting sheet is arranged between the coolant flow channel and the male tab switch;
    wherein the SMD switch exchanges heat with an upper end surface of a sidewall of the elliptical flow channel body through a heat conducting glue;

wherein the coolant flow channel is located around the sidewall of the mounting chamber; a space between each of the heat generating components and the mounting chamber is encapsulated with a heat conducting encapsulant; and wherein the coolant flow channel is communicated with the gap, such that the coolant flow channel performs heat exchange directly on the bottom surface and the side surface of the magnetic element while in operation.

2. The on-board charger with the heat dissipation structure according to claim 1, wherein the PCB is provided with a plurality of through holes which are penetrated up and down; the SMD switch is fixed on the PCB and corresponds to the through holes; an insulating film is arranged between the PCB and the coolant flow channel; the insulating film is provided with the heat conducting glue; after the PCB is fixedly pressed on the coolant flow channel, the heat conducting glue is in contact with the SMD switch through the through holes in the PCB; the SMD switch exchanges heat with the coolant flow channel through the heat conducting glue.

3. The on-board charger with the heat dissipation structure according to claim 1, wherein the flow channel body is arranged in the sidewall of the mounting chamber.

4. The on-board charger with the heat dissipation structure according to claim 1, wherein the male tab switch is arranged on the outer sidewall of the mounting chamber in which the heat generating components are located.

* * * * *